United States Patent [19]
Yamada et al.

[11] Patent Number: 5,946,183
[45] Date of Patent: Aug. 31, 1999

[54] ELECTROSTATIC CHUCK

[75] Inventors: Naohito Yamada, Kasugai; Masashi Ohno, Nagoya; Ryusuke Ushikoshi, Tajimi, all of Japan

[73] Assignee: NGK Insulators, Ltd., Japan

[21] Appl. No.: 08/705,988

[22] Filed: Aug. 30, 1996

[30]    Foreign Application Priority Data

Sep. 6, 1995  [JP]  Japan ..................................... 7-229190
Aug. 20, 1996 [JP]  Japan ..................................... 8-218259

[51] Int. Cl.⁶ .................................................. H02N 13/00
[52] U.S. Cl. ............................................ 361/234; 279/128
[58] Field of Search ............................. 361/234; 279/128

[56]            References Cited

U.S. PATENT DOCUMENTS

| | | | |
|---|---|---|---|
| 5,213,349 | 5/1993 | Elliott ....................................... | 279/128 |
| 5,280,156 | 1/1994 | Niori et al. ............................. | 361/234 |
| 5,382,469 | 1/1995 | Kubota et al. .......................... | 361/234 |
| 5,384,681 | 1/1995 | Kitabayashi et al. ................... | 361/234 |
| 5,384,682 | 1/1995 | Watanabe et al. ...................... | 361/234 |
| 5,463,525 | 10/1995 | Barnes et al. .......................... | 361/234 |
| 5,467,249 | 11/1995 | Barnes et al. .......................... | 361/234 |
| 5,522,131 | 6/1996 | Steger .................................... | 361/234 |
| 5,561,585 | 10/1996 | Barnes et al. .......................... | 361/234 |
| 5,606,485 | 2/1997 | Shamouilian et al. .................. | 361/234 |
| 5,631,803 | 5/1997 | Cameron et al. ....................... | 361/234 |

FOREIGN PATENT DOCUMENTS

| | | |
|---|---|---|
| 0 601 788 A2 | 6/1994 | European Pat. Off. . |
| 0 693 774 A2 | 1/1996 | European Pat. Off. . |
| 0 742 588 A2 | 11/1996 | European Pat. Off. . |
| 2-160444 | 6/1990 | Japan ............................... B23Q 3/08 |
| 2-120831 | 9/1990 | Japan ........................... H01L 21/302 |
| 5-87177 | 12/1993 | Japan ............................. H01L 21/68 |

OTHER PUBLICATIONS

IBM Technical Disclosure Bulletin, vol. 31, No. 1, Jun. 1, 1988, pp. 462–464, XP000119644 "Electrostatic Wafer Holder for Wafer Cooling During Reactive Ion Etching".

*Primary Examiner*—Fritz Fleming

[57]          ABSTRACT

An electrostatic chuck for attracting an object to be treated, includes a substrate, an insulating dielectric layer and at least one electrode provided between the substrate and the insulating dielectric layer, wherein the above object is to be attracted onto the electrode via the insulating dielectric layer and an average thickness of the insulating dielectric layer is not less than 0.5 mm and not more than 5.0 mm.

1 Claim, 7 Drawing Sheets

FIG_3
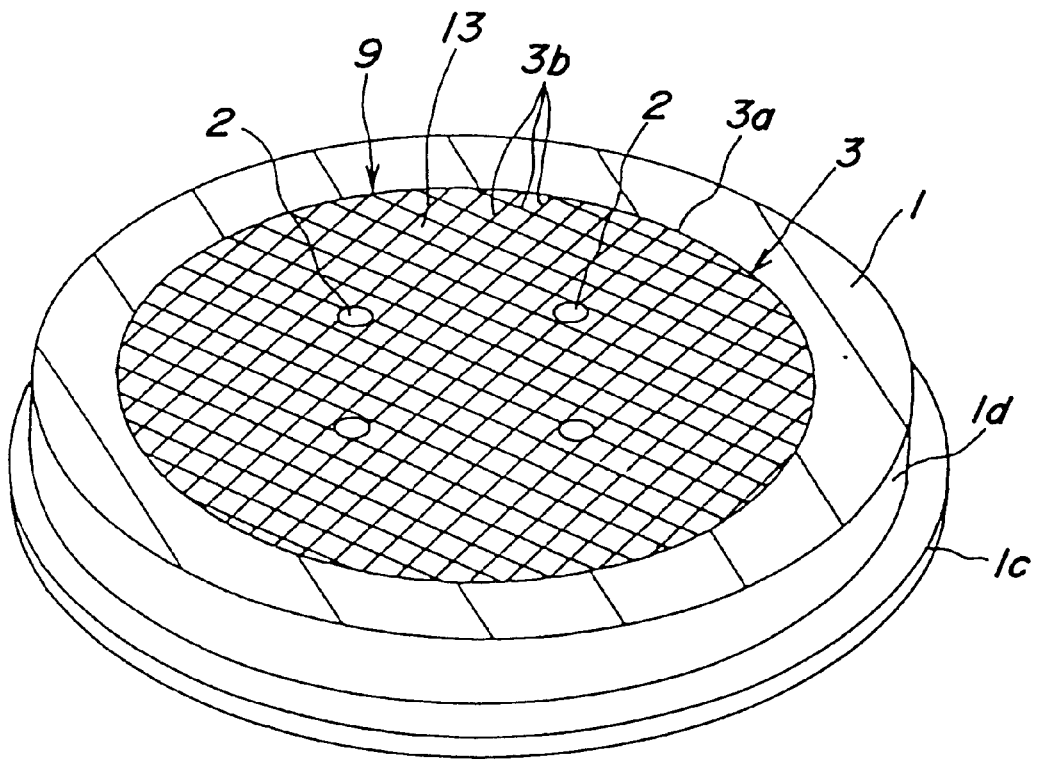
FIG_4
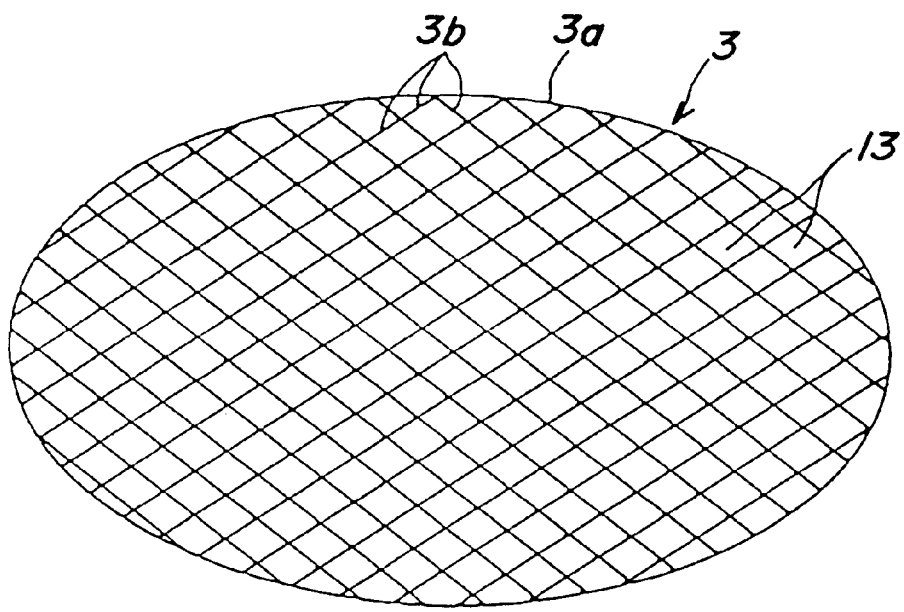

ELECTROSTATIC CHUCK

BACKGROUND OF THE INVENTION

(1) Field of the Invention

The present invention relates to an electrostatic chuck.

(2) Related Art Statement

At present, electrostatic chucks are used for attracting and holding semiconductor wafers in conveying, film-forming processes such as light exposure, CVD and sputtering, fine machining, washing, etching, dicing, etc. for the semiconductor wafers. In JP-B 5-87177, a laminate is produced in a filmy thickness of 30 to 400 μm by successively laminating a first insulating layer, a first bonding layer, an electrode layer, a second bonding layer and a second insulating layer, and an electrostatic chuck is produced by bonding this laminate to a metallic substrate. The first insulating layer, which is arranged between the electrode layer and an object to be treated, preferably has a thickness of 5 μm to 75 μm, which is tried to be made as small as possible so long as the insulating layer can withstand voltage applied. This meets a theory that the smaller the thickness of the insulating dielectric layer of the electrostatic chuck, the greater is the attracting force.

Turning to this point in more detail, the electrostatic attracting force (Coulomb's force) is in inverse proportion to the square of a distance between objects upon which this force acts. As the insulating dielectric layer of the electrostatic chuck becomes thicker, the distance between the electrode and the object to be treated proportionally increases. Correspondingly, the electrostatic attracting force decreases in inverse proportion to the square of the thickness of the insulating dielectric layer. For this reason, it is necessary that the insulating layer is made as thin as possible so as to increase the electrostatic attracting force.

In JP-A 2-160444, two or more laminate layers each constituted by an electrode and an insulating layer are formed on a substrate. The insulation resistances of the insulating films are made different from each other so that voltage to be applied to each electrode may be selectively controlled. This publication describes that the thickness of each insulating film is appropriately around 300 μm. For, in order to increase the electrostatically attracting force, the insulating film needs be thinner as mentioned above, whereas in order to prevent dielectric breakdown under application of high voltage, a certain thickness is necessary. To meet both of these contradictory requirements, the thickness of a few tens μm to 300 μm was appropriate. As described in JP-A 2-160444, as the temperature rises, the volume resistivity of the insulating film decreases. Accordingly, as the temperature rises, the leakage current increases in the insulating film, so that the semiconductor film already formed on the the semiconductor wafer is unfavorably broken.

Further, Japanese Utility Model Application Laid-open No. 2-120831 discloses that grooves are formed on a semiconductor wafer-placing face and helium gas is fed into the grooves. That is, a substrate to be treated, such as a semiconductor wafer, need be heated or cooled depending upon the purpose of a process employed. For this reason, it is necessary that a heating source or a cooling source is installed under the substrate of the electrostatic chuck and heat is exchanged between the substrate and the semiconductor wafer or the like. At that time, since the semiconductor wafer merely contacts the attracting surface of the electrostatic chuck, so that they are placed in an adiabatic vacuum state inside a vacuum chamber of a semiconductor-producing apparatus. That is, since no heat conduction occurs through convection, heat conduction is very small. Thus, as mentioned above, the grooves are filled with helium gas so that heat may be effectively conducted between the semiconductor wafer and the attracting surface through the helium gas.

When a semiconductor wafer is treated in the state that it is attracted upon an electrostatic chuck, such an electrostatic chuck is used over a wide temperature range. As mentioned above, if the thickness of an insulating film of the electrostatic chuck is about a few μm to 300 μm, for example, a current leaked from the insulating film largely increases at more than 300° C., even though extremely large attracting force may be obtained at room temperature. Consequently, it was made clear that a semiconductor film already formed on the semiconductor wafer might be broken. For this reason, a special construction as described in JP-A 2-160444 needed to be employed so that the electrostatic chuck might be used in a high temperature range. However, such a construction is extremely complex, and it does not offer a direct solution against the above problems.

It may be considered that a material maintaining a high volume resistivity even at high temperatures is selected or developed. However, a plastic material having a high volume resistivity generally possess low heat resistance, and it is essentially difficult to use such a plastic material in a high temperature range. On the other hand, many of ceramic materials having high heat resistance possess their volume resistivity which decrease in a high temperature range. In addition to the requirement for the volume resistivity, the substrate of the electrostatic chuck must satisfy other requirements such as the mechanical strength, but it is generally difficult to select or develop a material satisfying the above requirements. Japanese Utility Model Registration Application Laid-open No. 2-120,831 also suffer the above problems.

In view of the above, the present inventors produced insulating dielectric layers having thicknesses of a few tens μm to 300 μm from various ceramic materials, and examined them with respect to attracting force and leakage current. In general, in order to exhibit sufficiently high attracting force, the insulating dielectric layer needs to have a volume resistivity of $1\times10^{13}$ Ω·cm or less in an operating temperature range.

It was clarified that an electrostatic chuck having an insulating dielectric layer with a volume resistivity, for example, in a range of $1\times10^{11}$ to $1\times10^{13}$ Ω·cm at room temperature exhibited high attracting force in a range of room temperature to 200° C., but leakage current largely increased at temperatures of more than 200° C., which might damage a semiconductor wafer. It was also clarified that the electrostatic chuck having the insulating dielectric layer with the volume resistivity of $1\times10^{14}$ Ω·cm to $1\times10^{16}$ Ω·cm at room temperature had a high attracting force in a temperature range of 100° C. to 500° C., but its leakage current largely increased when the temperature was more than 500° C. so that the semiconductor wafer might be damaged. It was further clarified that in the electrostatic chuck with the insulating dielectric layer having the volume resistivity of $1\times10^9$ Ω·cm to $1\times10^{10}$ Ω·cm at room temperature exhibited high attracting force in a temperature range of −20° C. to 100° C., but it damaged the semiconductor wafer due to largely increased leakage current at temperatures of more than 100° C.

In this way, it was clarified that although the conventional ceramic electrostatic chucks all exhibited sufficiently high attracting forces in an optimum temperature range, the leakage currents largely increased if the operating temperature rose and the volume resistivity of the insulating dielectric ceramic layer decreased to $10^9$ Ω·cm or less. Therefore, it was clarified that the conventional electrostatic chucks had a problem in such a use in which a use temperature range is wide, for example, in such a case where various treatments are effected for semiconductor wafers chucked.

Further, in Japanese Utility Model Registration Application Laid-open No. 2-120831, heat needs to be conducted between the semiconductor wafer and the electrostatic chuck uniformly as viewed planarly from the attracting surface thereof. For, even if the temperature of the attracting surface of the electrostatic chuck is equal, a large difference in temperature of the surface of the wafer occurs between a helium gas-filled portion and a helium gas non-filled portion inside the grooves. Consequently, the quality of the resulting semiconductor film varies, which may cause unacceptable products during the production process. Therefore, it is necessary to keep the pressure of the helium gas constant in every portion inside the grooves.

However, in the locations of the actual attracting chuck from which helium gas is to be fed are limited, and their feed openings of the helium gas-feeding locations are away from adjacent ones. Therefore, as the location goes away from a blow-out opening of the helium gas, the pressure of the gas rapidly decreases. In particular, as mentioned above, the thickness of the insulating dielectric layer is merely around a dozen μm to 300 μm, and the insulating dielectric layer merely has a minimum thickness required to maintain a necessary dielectric breakdown strength. This dielectric breakdown strength is a value of a minimum thickness portion of the insulating dielectric layer. For these reasons, the thickness of the grooves must inevitably be set at a few μm to a dozen μm. However, the grooves having a depth of a few μm to a dozen μm gives a large resistance against diffusion of the gas, so that the gas is not sufficiently diffused. Consequently, a large pressure difference occurs inside the grooves and the temperature varies in the semiconductor wafer, so that the quality of the film formed becomes non-uniform. Simultaneously with this, increase in the depth of the grooves causes antonymy that dielectric breakdown may occur between the grooves and the electrode.

SUMMARY OF THE INVENTION

It is an object of the present invention to provide an electrostatic chuck for attracting an object to be treated, which can reduce leakage current in a insulating dielectric film to prevent an adverse effect upon the object and simultaneously to maintain the attracting force for the object high, even in a case where the electrostatic chuck is used in a temperature range in which the volume resistivity of the insulating dielectric film is decreased.

It is another object of the present invention to provide an electrostatic chuck for attracting an object to be treated, which can reduce difference in pressure of the gas inside grooves to uniformly conduct heat between every portion of the object and the attracting surface of the electrostatic chuck and simultaneously with this, to reduce the possibility of the dielectric breakdown as small as possible, in a case where a gas introducing hole is provided to be opened at the attracting face of the insulating dielectric layer of the electrostatic chuck and the gas is fed to the grooves or concaves of an attracting face side.

The electrostatic chuck according to the present invention is to attract an object to be treated, and comprises a substrate, an insulating dielectric layer and an electrode provided between the substrate and the insulating dielectric layer, wherein said object is to be attracted onto the electrode via the insulating dielectric layer and the average thickness of the insulating dielectric layer is not less than 0.5 mm and not more than 5.0 mm.

Another electrostatic chuck according to the present invention is to attract an object to be treated, and comprises a substrate, an insulating dielectric layer and an electrode provided between the substrate and the insulating dielectric layer, wherein said object is to be attracted onto the electrode via the insulating dielectric layer, a gas-introducing hole is provided at least in said insulating dielectric layer while being opened to an attracting surface of the insulating dielectric layer, a gas-diffusing depression is formed in the insulating dielectric layer on a side of said attracting surface, and a depth of the gas-diffusing depression is no less than 100 μm and not more than 5.0 mm.

A further electrostatic chuck according to the present invention is to attract an object to be treated, comprises a substrate, an insulating dielectric layer and an electrode provided between the substrate and the insulating dielectric layer, wherein said object is to be attracted onto the electrode via the insulating dielectric layer, a gas-introducing hole is provided at least in said insulating dielectric layer while being opened to an attracting surface of the insulating dielectric layer, a gas-diffusing depression is formed in the insulating dielectric layer on a side of said attracting surface, and a distance between a bottom surface of the gas-diffusing depression and the electrode is not less than 500 μm and not more than 5.0 mm.

These and other objects, features and advantages of the invention will be appreciated when considered in conjunction with the attached drawings, with the understanding that some modifications, variations and changes of the invention could be easily made by the skilled person in the art to which the invention pertains.

BRIEF DESCRIPTION OF THE DRAWINGS

FIG. 3 is a broken perspective view for illustrating an electrode of the electrostatic chuck in FIG. 2 and its vicinity;

FIG. 4 is a perspective view of a preferred net-shaped electrode as an electrode;

DETAILED DESCRIPTION OF THE INVENTION

Figure 1:
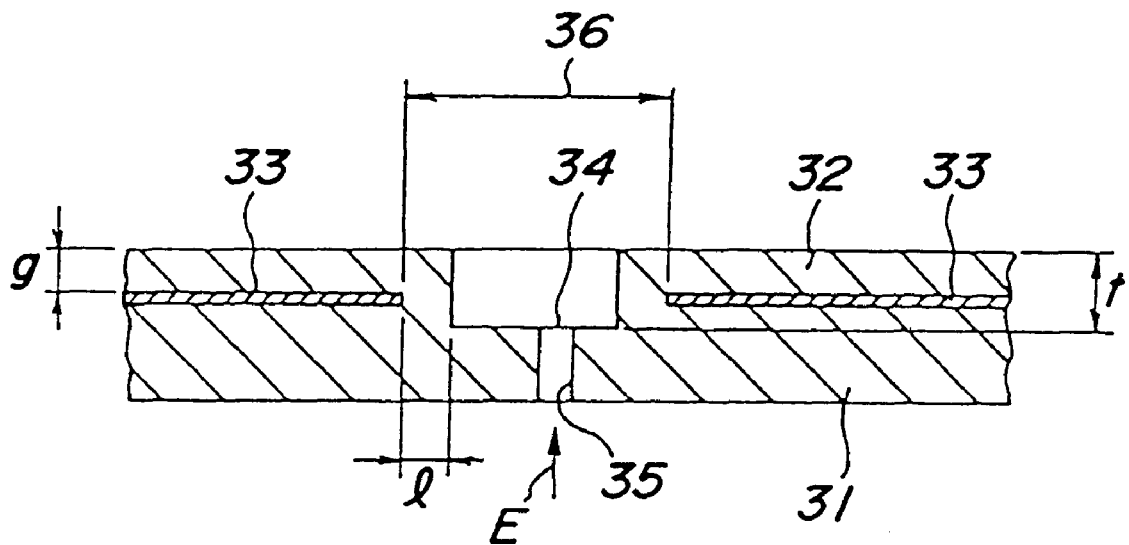
FIG. 1 is a sectional view for schematically illustrating a part of an embodiment of the electrostatic chuck according to the present invention.

The present inventors have been engaged in investigations of electrostatic chucks made of an insulating ceramic material so that the leakage current may be reduced and the attracting force may be enhanced at various temperatures under vacuum condition. During this investigation, the inventors discovered that the leakage current can be suppressed to a lower level by increasing the thickness of the insulating dielectric layer to not less than 500 µm. Since this is about 10 times as great as the thickness of the insulating dielectric layers of the conventional electrostatic chucks, the amount of the leakage current can be reduced to about 1/10 if the same material is used.

In addition to the above discovery, the present inventors further discovered that even if the thickness of the insulating dielectric layer is increased to not less than 500 µm, the attracting force of the semiconductor wafer is not conspicuously decreased, and attracting force sufficient for attracting the semiconductor wafer can be assured. The present inventors reached the present invention based on the above discovery. That is, it has been considered that since the attracting force decreases in inverse proportion to the square of the thickness of the insulating dielectric layer, an electrostatic chuck with an insulating dielectric layer having such a thickness as increased above could not be used.

It is said that if an electrostatic chuck uses an insulating dielectric layer with a low volume resistivity, charges move, appear at the surface of the dielectric layer, and result in high electrostatic force between the semiconductor wafer and the surface of the dielectric layer under application of voltage. However, the relationship between the thickness of the insulating dielectric layer and the attracting force has not been formulated up to now, and the relationship has not been presumed. Therefore, electrostatic chucks with insulating dielectric layers having thicknesses over the conventional range have not been even investigated in the light of the conventional theory.

However, the present inventors discovered that an electrostatic chuck with an insulating dielectric layer having a thickness of 500 µm to 5.0 mm has sufficiently high attracting force in a temperature range causing reduction in the volume resistivity of the insulating dielectric layer and consequently the inventors accomplished the present invention. In addition, the leakage current is conspicuously reduced, and the possibility of damages upon an object which is attracted to the electrostatic chuck can be diminished.

Specifically, it was discovered that the electrostatic chuck with the insulating dielectric layer having the volume resistivity of $1 \times 10^{11}$ to $1 \times 10^{13}$ Ω·cm had high attracting force in a temperature range of room temperature to 200° C., and could stably attract the semiconductor wafer even at more than 200° C., and that the semiconductor wafer did not peel off from the chuck even when a gas at pressure of 10 to 20 torr was flown between the semiconductor wafer and the attracting face of the chuck in an ordinary manner. It was also discovered that similar results were obtained even at not less than 500° C. for the electrostatic chuck with the insulating dielectric layer having the volume resistivity of $1 \times 10^{14}$ Ω·cm to $1 \times 10^{16}$ Ω·cm at room temperature. Furthermore, it was discovered that similar results were obtained even at not less than 100° C. for the electrostatic chuck with the insulating dielectric layer having the volume resistivity of $1 \times 10^{9}$ Ω·cm to $1 \times 10^{10}$ Ω·cm at room temperature.

As mentioned above, it was confirmed that excellent attracting force can be obtained in the electrostatic chuck with the insulating dielectric layer having such a large thickness as the skilled person in the art has not considered, and that the leakage current can be simultaneously largely reduced.

In addition, if the electrostatic chuck is used for a semiconductor-producing apparatus, the chuck is exposed to a halogen based corrosive gas as an etching gas or a cleaning gas. In a process such as sputtering, CVD or etching, the chuck is exposed to plasma. If the insulating dielectric layer made of even a ceramic material is subjected to the halogen based corrosive gas, a reaction product is produced on its surface, and dielectric breakdown may occur starting from any point in a layer of the reaction product through use for a long time under exposure to the plasma. The dielectric breakdown can be assuredly prevented by setting the thickness of the insulating dielectric layer at not less than 500 µm from the standpoint of the corrosion resistance and the plasma resistance.

According to the present invention, the leakage current is more conspicuously reduced by setting the thickness of the insulating dielectric layer at not less than 1.0 mm, whereas the above attracting force is further enhanced by setting the thickness of the insulating dielectric layer at not more than 3.0 mm.

Further, according to the electrostatic chuck of the present invention, the surface roughness, Rmax, of the surface of the insulating dielectric layer is preferably not more than 3 µm. By so doing, the attracting force is particularly increased. If the surface roughness, Rmax, of the insulating dielectric layer is not less than 4 µm, the attracting force is not almost increased even if the voltage applied to the electrodes is increased, whereas if the surface roughness, Rmax, is not more than 3 µm, the attracting force is not only largely increased, but also the attracting force sharply varies to response the increase in the voltage applied to the electrodes.

Further, if the maximum pore diameter of the insulating dielectric layer is set at not more than 5 µm, the surface roughness, Rmax, thereof can be controlled to not more than 3 µm, whereas if the maximum pore diameter is more than 5 µm, the surface roughness, Rmax, of the surface of the insulating dielectric layer could not be controlled to not more than 3 µm even if the surface was finely polished.

The porosity of the insulating dielectric layer is preferably not more than 3%. For, it was clarified that if the thickness of the insulating dielectric layer falls in the range of the present invention and the surface roughness, Rmax, is set at not more than 3 µm, the attracting force can be most enhanced, when the porosity is not more than 3%. It was further clarified that if the porosity is more than 3%, the attracting force was not conspicuously enhanced even if the thickness and Rmax of the insulating dielectric layer are controlled to the above-mentioned respective ranges, the attracting force could not be conspicuously enhanced.

The electrostatic chuck according to the present invention with the insulating dielectric layer having the volume resistivity of not more than $1 \times 10^{13}$ Ω·cm can afford high attracting force, and can be favorably used in practice. Particularly, when the volume resistivity of the insulating dielectric layer is even in a range of not more than $1 \times 10^{9}$ Ω·cm to not less than $1 \times 10^{7}$ Ω·cm, sufficiently high attracting force can be obtained, and leakage current can be conspicuously reduced.

The volume resistivity of the insulating dielectric layer is more preferably set at not less than $1 \times 10^{8}$ Ω·cm from the standpoint of the reduction in the leakage current. However, if the leakage current up to about 10 mA is acceptable with respect to an 8-inch wafer, excellent effects can be obtained according to the present invention even if the volume resistivity of the insulating dielectric layer is in a range of $1 \times 10^{7}$ Ω·cm to $1 \times 10^{8}$ Ω·cm.

When the insulating dielectric layer of the electrostatic chuck according to the present invention is provided with grooves or depressions for dispersing a gas over the attracting face of the insulating dielectric layer as mentioned above, the gas can be uniformly dispersed or diffused in the gas-diffusing depression if the depth of depression is set at not less than 100 μm so that the temperature of a target object to be treated, such as a semiconductor wafer may be made uniform. As mentioned above, if the thickness of the insulating dielectric layer is more than 5.0 mm, the attracting force decreased. Therefore, the depth of the gas-diffusing depression is preferably not more than 5.0 mm.

The present invention can be embodied in an electrostatic chuck as shown in FIG. 1. An electrode 33 is formed on a substrate 31, and an insulating dielectric layer 32 is made upon the electrode 33. A gas-diffusing depression 34 is provided to be opened at a surface side of the insulating dielectric layer 32, and a gas-introducing hole 35 is communicated with the gas-diffusing depression 34. The gas-introducing hole 35 is opened at a surface side of the substrate 31, and connected to a gas feeder not shown. A gas is flown into the gas-diffusing depression 34 through the gas-introducing hole 35 as shown by an arrow E.

The depth t of the gas-diffusing depression 34 as measured from the attracting face is greater than that g of the electrode 33 from the attracting face, so that the electrode is buried in the substrate, while avoiding the location of the gas-diffusing depression 34. That is, the electrode 33 is buried in the substrate such that the electrode 33 is removed in an area in which the gas-diffusing depression 34 exists and the peripheral portion of the electrode 33 is not exposed to the gas-diffusing depression. In this case, the distance "1" between the peripheral portion of the electrode 33 and the gas-diffusing depression 34 must be about 1 mm so as to prevent dielectric breakdown. Owing to this, since the the electrode 33 is completely missing in the gas-diffusing depression 34 and its vicinity, the attracting force cannot be obtained there at all.

Therefore, the electrode is preferably laid further under the gas-diffusing depression so that the attracting force may be generated over the entire attracting face of the chuck including the gas-diffusing depression. In this case, dielectric breakdown can be assuredly prevented by setting the distance between the bottom of the gas-diffusing depression and the electrode at not less than 500 μm.

In a particularly preferable embodiment, the thickness of the insulating dielectric layer is set at not less than 1 mm; the depth of the gas-diffusing depression is not less than 100 μm, and preferably not less than 500 μm; and the electrode is laid further under the gas-diffusing depression, while the distance between the electrode and the bottom face of the gas-diffusing depression is set at as much as not less than 500 μm. If the thickness of the insulating dielectric layer is increased like this, the electrode needs not be partially omitted even if the depth of the gas-diffusing depression is made large enough to excellently diffuse the gas. Consequently, the electrostatic attracting force can be generated over a wider area. In this embodiment, the thickness of the insulating dielectric layer is not more than 5.0 mm, more preferably not more than 3.0 mm, whereas the depth of the gas-diffusing depression is not more than 3.0 mm, and particularly preferably not more than 2.0 mm. In addition, the distance between the electrode and the bottom face of the gas-diffusing depression is preferably not more than 3.0 mm, particularly preferably not more than 2.0 mm.

Since the thickness of the insulating dielectric layer is not more than 300 μm in the conventional electrostatic chuck, it is necessary to employ a green ceramic sheet-laminating process, a gas phase growing process or a plasma spraying process, which unfavorably causes a high production cost. However, according to the present invention, an insulating dielectric body having a thickness of a few mm is produced by sintering, which is ground to make an attracting face of the resulting insulating dielectric layer flat, while a gas-diffusing depression is formed by machining. By so doing, the production cost can be conspicuously reduced.

The electrostatic chuck according to the present invention can be used as a plasma-generating electrode unit by connecting the electrode of the chuck to a high frequency electric power source and simultaneously applying a DC voltage and a high frequency voltage to the electrode. In this case, if the electrode is made of tungsten and the frequency of the high frequency voltage is 13.56 MHz, the thickness of the electrode is preferably not less than 430 μm. However, since it is difficult to form the electrode of such a thickness by screen printing, the electrode is preferably constituted by a metallic bulky body. If the thickness of the insulating dielectric layer is in a range of 0.5 mm to 5.0 mm, self heat generation due to the energy loss of the dielectric body is not so great if the dielectric loss tangent is not more than 0.1 at the above frequency. Thus, the electrostatic chuck can be used as the high frequency electrode unit without a problem.

When the electrostatic chuck according to the present invention was installed in a semiconductor-producing apparatus using a halogen based corrosive gas, the chuck was corroded with the halogen based corrosive gas such as $ClF_3$ in some case. If such an electrostatic chuck may be exposed to the halogen based corrosive gas, an electrostatic chuck may be preferably used in such a case, which includes a substrate of a dense ceramic material, an insulating dielectric layer of a dense ceramic material, and an electrode of a planar metallic bulky body integrally sintered. In this electrostatic chuck, since the substrate surrounding the electrode is an monolithic sintered body having no joining face, the electrode can be prevented from the corrosion.

As the ceramic material constituting the substrate and the insulating dielectric layer, nitride-based ceramic materials such as silicon nitride, aluminum nitride, boron nitride, and sialon, silicon carbide and alumina-silicon nitride composite material are preferred. From the standpoint of thermal shock resistance, silicon nitride is particularly preferred. From the standpoint of the corrosion resistance against the halogen based corrosive gas, aluminum nitride is particularly preferred.

Aluminum nitride is a material which is particularly hard to be sintered. For this reason, it is difficult to obtain a sintered body having a relatively high density by a conventional pressureless sintering process. Therefore, it has been a common practice to promote the sintering of aluminum nitride by incorporating a large amount of sintering aids into aluminum nitride powder. However, particularly if the resulting chuck is installed in the semiconductor-producing apparatus, such sintering aids act as impurities, which may cause contamination of the semiconductor.

Meanwhile, a sintered body obtained by hot press sintering a mixture of aluminum nitride powder added with 5% yttria as a sintering aid had a relative density of more than 99%, and exhibited excellent corrosion resistance against the halogen based corrosive gas. Furthermore, when aluminum nitride powder containing not more than 1% of impurities was used, a dense sintered body having a relative density of more than 99% could be obtained by hot press sintering the powder. Therefore, an electrostatic chuck made of aluminum nitride having purity of not less than 95% and particularly not less than 99% with excellent corrosion resistance could be produced.

The electrostatic chuck according to the present invention may be produced by the following process. First, a planar electrode made of a metallic bulky body is buried in a ceramic green body. This step is carried out as follows:

Method 1:

A preliminarily green body is prepared, and the above electrode is placed on this preliminarily green body. Then, a ceramic powder is charged over this electrode on the preliminarily green body, and the resultant is uniaxially press molded.

Method 2:

Two planar green bodies are prepared by cold isostatic press, and an electrode is held between two planar green bodies. Then, the assembly of the two green bodies and the electrode is hot pressed in this state.

In the method 2, the density of the preliminarily green body is increased and the variation in density of the green body is smaller owing to the cold isostatic press, as compared with the method 1. Therefore, as compared with the method 1, a shrinkage amount of the green body during the hot press is smaller and variation in density is smaller after the firing. As a result, the average dielectric strength of the sintered body is relatively larger.

The above function and effect is particularly important for the electrostatic chuck. For, due to the above-mentioned reasons, the average dielectric strength of the dielectric layer of the electrostatic chuck can be further enhanced, and its reliability can be greatly high.

In this sense, the relative density of the green body obtained by the cold isostatic press is most preferably not less than 60%.

Further, in order to screen print an electrode on a surface of a green body obtained by the cold isostatic press process, the green body needs be dewaxed for a long time under a non-oxidizing atmosphere. In this respect, since such an extended time dewaxing step does not exist in a case where the electrode is held between the green bodies obtained by the cold isostatic press, this case is advantageous from the standpoint of the mass production.

Further, assume that the filmy electrode is formed by the screen printing. It is considered that since the filmy electrode is deformed during the hot pressing, another problem consequently occurs that the thickness of the dielectric layer on the electrode film becomes non-uniform. In this respect, since the deformation of the electrode can be prevented by the rigidity of the electrode itself during the hot pressing when the electrode made of a planar metallic bulky body is buried, the non-uniform thickness of the dielectric layer can be prevented. The thickness of the dielectric layer is important for the electrostatic chuck, because this thickness rules the chucking performance. The wording "planar metallic bulky body" used here means, for example, a metallic bulky body formed as a monolithic planar shape as shown in FIGS. 3, 4 and 5 without forming a wire body or a planar body in a spiral or meandered or zigzag shape.

Since the electrode is subjected to hot press in its thickness direction, it is preferably a planar electrode from the standpoint of preventing the warping during the hot press. The electrode is preferably made of a high melting point metal in an application where the temperature is raised to a high temperature of 600° C. or more at the maximum.

As such a high melting point metal, tantalum, tungsten, molybdenum, platinum, rhenium, hafnium and their alloys may be recited. From the standpoint of preventing contamination of the semiconductors, tantalum, tungsten, molybdenum, platinum and their alloys are preferred. As an object to be treated by using the electrostatic chuck, aluminum wafers may be recited by way of example in addition to the semiconductor wafers.

The configuration of the electrode includes a planar electrode having a number of small holes, and a net-shaped electrode besides the thin planar electrode. When the planar electrode having a number of the small holes or the net-shaped electrode is used as the electrode, the ceramic powder flows around through the numerous small holes or meshes, the joining force between the substrate and the insulating dielectric layer on the opposite sides of the electrode becomes greater to enhance the strength of the substrate. Further, when the electrode takes a thin planar shape, a large stress occurs particularly at the peripheral portion of the electrode, so that the substrate might be broken due to this stress. However, when the electrode is the planar body having numerous small holes or the net body, that stress is effectively dispersed by numerous small holes and meshes.

As the planar body having numerous small holes, a punched metal may be recited by way of example. However, when the electrode is to be made of a high melting point metal punched, such a high melting point metal itself has high hardness. Thus, it is difficult to punch numerous small holes in such a high melting point metal, and such punching raises a working cost.

In this respect, when the electrode is made of a metal net, wires made of the high melting point metal are easily available, and the metal net can be easily produced by knitting the wires. Therefore, the electrode can be easily produced by using such wires.

The mesh shape, the wire diameter, etc. of the metal net are not particularly limited. However, the metal nets having a wire diameter range of 0.03 mm to 0.5 mm and a mesh range of 150 meshes to 6 mesh could be used without no particular problem. Further, the sectional shape of the wires constituting the metal net as viewed in the width direction may be circular, elliptical, rectangular or variously rolled shapes.

Figure 2:
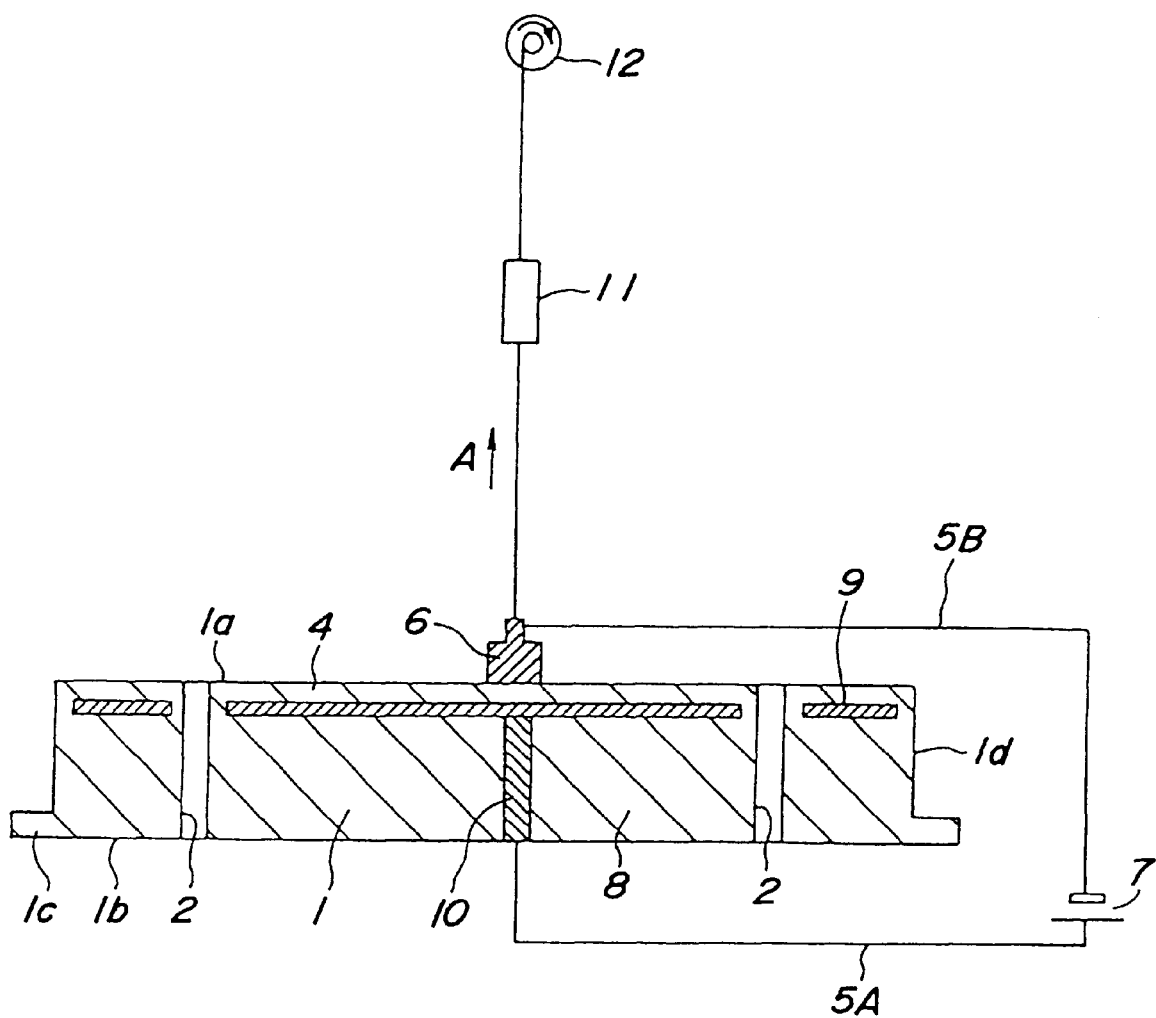
FIG. 2 is a sectional view for schematically illustrating another embodiment of the electrostatic chuck according to the present invention.

Preferred embodiments of the present invention will be explained below with reference to the drawings. FIG. 2 is a sectional view schematically illustrating an electrostatic chuck. FIG. 3 is a perspective view showing the electrostatic chuck in FIG. 2 partially cut off. FIG. 4 is a perspective view showing an electrode 3 made of a metal net.

A ring-shaped flange 1c is provided at a peripheral face 1d of a substrate 1 having an almost discoidal shape, and an electrode 9 made of a metal net 3 is buried inside the substrate 1. An insulating dielectric layer 4 is formed in a given thickness on a surface of the substrate 1 on a side 1a upon which an object to be treated, such as a semiconductor wafer, is to be placed. The thickness of the insulating dielectric layer 4 is selectively determined according to the present invention. A terminal 10 is buried in a supporting portion 8 of the substrate 1, one end of the terminal 10 being connected to the electrode 9, while the other end face of the terminal 10 being exposed outside at the rear surface 1b of the substrate. Formed in the substrate 1 at given locations are holes 2 for lifting pins to vertically move the semiconductor wafer.

A DC electric power source 7 is connected to the terminal 10 via an electric wire 5A. In order to measure an attracting force of the electrostatic chuck, a stainless weight 6 is arranged on the attracting face 1a, and an electric wire (earthed wire) 5B is connected to the stainless weight 6. The stainless weight 6 is connected to a load cell 11 for the measurement of a load, and the stainless weight 6 connected to the load cell 11 is pulled up in a direction of an arrow A by means of a stepping motor 12. The attracting force can be determined by a formula: (load at which the weight 6 is released from the attracting face of the dielectric layer—a mass of the weight)/(the sectional area of the weight on the attracting surface).

The electrode 9 is constituted by a metal net 3 as shown in FIGS. 3 and 4. The metal net is constituted by a circular frame wire 3a and wires 3b which are vertically and laterally arranged inside the frame wire 3a to form meshes between them.

Figure 5A:
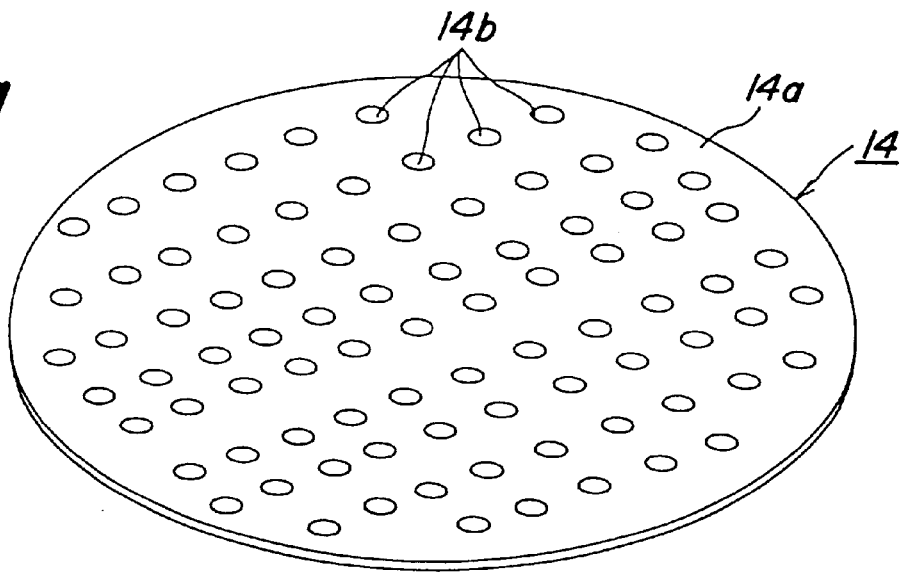
FIG. 5(a) is a perspective view for illustrating a preferred punched metal as the electrode, FIG. 5(b) a perspective view for illustrating a round thin plate to be used as the electrode, and FIG. 5(c) a plane view for illustrating a thin plate to be used as the electrode.

FIG. 5(a) is a perspective view of a punched metal 14 to be used as an electrode 9. The punched metal 14 has a circular shape, and a number of round holes 14b are formed in a circular flat plate 14a as in a checkered pattern.

Figure 5B:
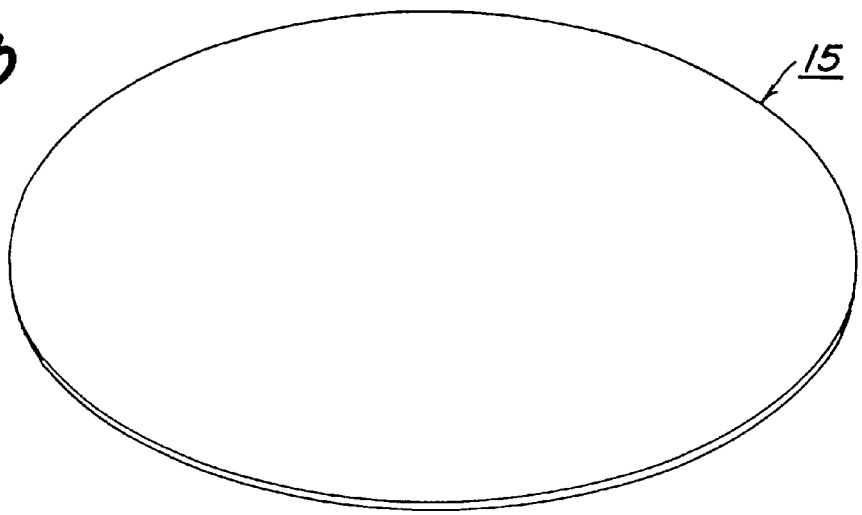
Figure 5C:
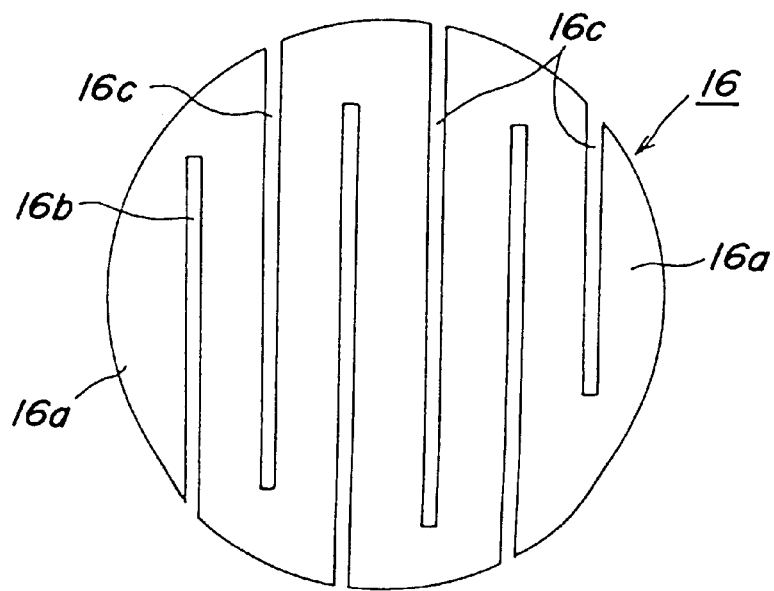

FIG. 5(b) is a perspective view for showing a round thin plate 15 to be used as the electrode 9. FIG. 5(c) is a plane view of a thin plate 16 to be used as the electrode 9. In the thin plate 16, linear slender cuts 16b and 16c are formed in parallel in totally six lines. Among these linear slender cuts, three linear slender cuts 16b are opened to a lower side in FIG. 5c, and the remaining three linear slender cuts 16c are opened to the upper side. These cuts 16b and 16c are alternatively arranged. Since such a configuration is used for the electrode, a thin and long conductive passage is formed in the thin plate. Terminals are connected to opposite ends 16a of the conductive passage.

Figure 6:
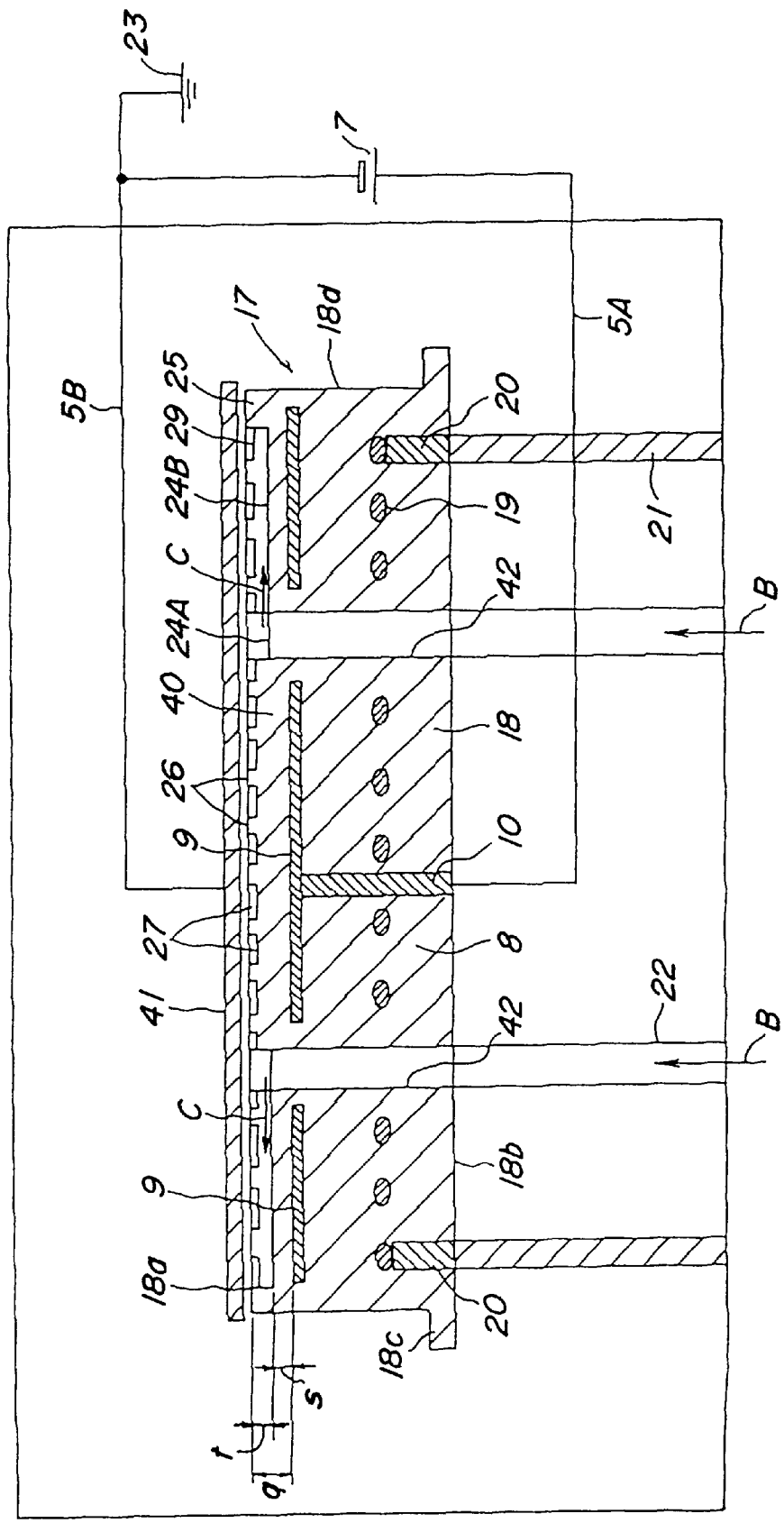
FIG. 6 is a further embodiment of the electrostatic chuck according to the present invention.
Figure 7:
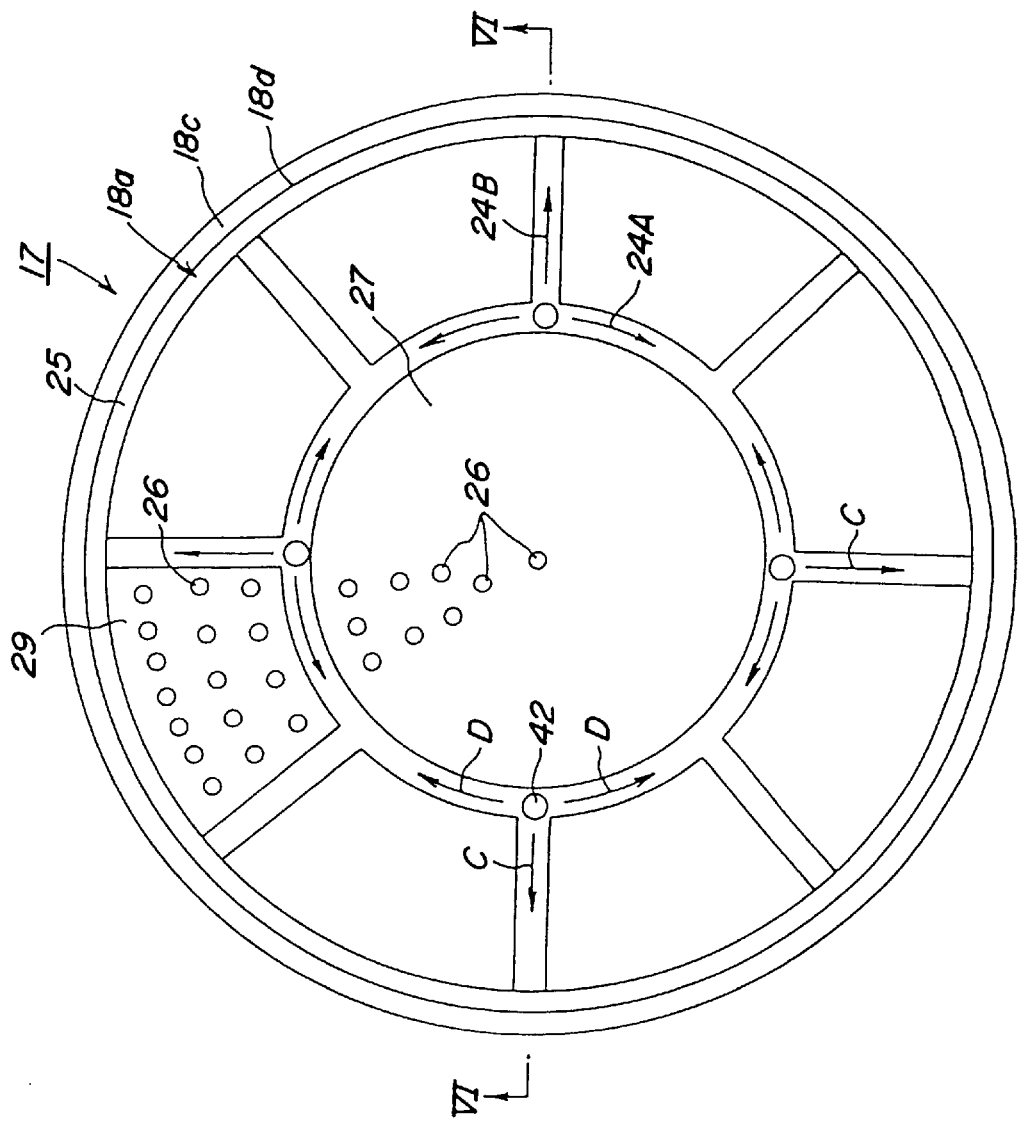
FIG. 7 is a plane view for schematically illustrating the electrostatic chuck in FIG. 6.

FIG. 6 is a sectional view for schematically illustrating another preferred embodiment of the electrostatic chuck according to the present invention, and FIG. 7 is a plane view for illustrating the electrostatic chuck in FIG. 6. A ring-shaped flange 18c is provided at a peripheral face 18d of a substrate 18 having an almost discoidal shape, and an electrode 9 is buried inside the substrate 9. An insulating dielectric layer 40 is formed on a surface of the substrate 18 on a side 18a upon which an object to be treated, such as a semiconductor wafer, is to be placed. A terminal 10 is buried in a supporting portion 8 of the substrate 18, one end of the terminal 10 being connected to the electrode 9, while the other end face of the terminal 10 being exposed outside at the rear surface 18b of the substrate 18.

A DC electric power source 7 is connected to the terminal 10 via an electric wire 5A. The object 41 is placed on the attracting face 18a, and is connected to a negative pole of the DC electric power source 7 and an earth 23 via an electric wire 5B. Gas-introducing holes 42 are formed in the substrate 18 at given locations, and continued to a gas-diffusing depression 24A. In this embodiment, the gas-diffusing depression 24A surrounds a circular discoidal portion 27, and the four gas-introducing holes 42 are provided at symmetrical locations at an equal interval such that the gas-introducing holes are opened to the gas-diffusing depression 24A. Numerous small projections 26 are regularly provided on the discoidal portion 27.

Linear gas-diffusing depressions 24B are radially outwardly extended from the gas-diffusing depression 24A. Among the gas-diffusing depressions 24B are formed totally eight trapezoidal-section portions 29. A number of circular projections 26 are also regularly provided on each of the trapezoidal-section portions 29. An annular projection 25 is provided at an outer peripheral side of the trapezoidal-section portions 29 so as to surround the entire attracting surface. The end of each of the gas-diffusing depressions 24B is partitioned by the projection 25.

Gas feed pipes 22 are connected to openings of the gas-introducing holes 42 on the rear face side 18b, and this feed pipes 22 are in turn connected to a feeder not shown. A resistive heating element 19 is buried in the supporting portion 8 of the substrate 18, and terminals 20 are connected to the opposite ends of the resistive heating element 19. To each of the terminals 20 is connected an electric power feed cable 21, and the cable 21 is in turn connected to an electric power source.

According to the present invention, the thickness g of the insulating dielectric layer 40 is selected to be in a range of 500 μm to 5.0 mm. The depth t of the gas-diffusing depressions 24A and 24B and the distance s between the bottom face of the gas-diffusing depression and the electrode are selectively determined according to the present invention. On operation of the electrostatic chuck, a gas is fed through the feed pipes 22 in an arrow B direction, passed through the gas-introducing holes 42, and blown out from their outlets on the attracting surface side in arrow C directions. The gas flows in the gas-diffusing depression 24A in an arrow D direction in a circular shape as viewed in plane, and also flows toward the projection 25 through the gas-diffusing depressions 24B in the arrow C directions. The gas is dispersed over the circular discoidal and trapezoidal-section portions 27, 29 excluding the round projections 26 so that the gas may be uniformly dispersed all over the rear face of the object to be treated.

The residual attracting force upon the object to be treated can be controlled by the design of the projections 26 so that the residual attracting force may not be excessive.

EXPERIMENTS

In the following, more concrete experimental results will be explained.

Experiment 1

An electrostatic chuck as shown in FIGS. 6 and 7 was produced. An electrode was buried in a green body composed of aluminum nitride powder having a purity of 99.9%, and a sintered body was obtained by hot press sintering the green body at the hot press temperature of 1910° C., so that the volume resistivity of an insulating dielectric layer was controlled to $1 \times 10^{11}$ Ω·cm at room temperature.

As an electrode, a metal net made of molybdenum was used. This metal net was obtained by knitting molybdenum wires having a diameter of 0.12 mm at a density of 50 wires per one inch. The surface of the insulating dielectric layer was machined to adjust the thickness thereof. A hole was formed in the sintered body from a rear face side by using a machining center, and a terminal was joined to the electrode. The relative density of the aluminum nitride sintered body constituting the substrate and the insulating dielectric layer was 99%.

The average thickness of the insulating dielectric layer was varied as shown in Table 1. Each electrostatic chuck was placed in a vacuum chamber, and electric power was applied to a resistive heating element 19 in a controlled condition so that the temperature of the electrostatic chuck might be 200° C. The volume resistivity of the insulating dielectric layer at 200° C. was $2 \times 10^8$ Ω·cm. The attracting force was measured by the method explained with reference to FIG. 2. The voltage was 500 V or 1000 V. Results in the voltage of 500 V are given in Table 1, and those in the voltage 1000 V are shown in Table 2. The measurement values are given with respect to unit of 5 g/cm².

TABLE 1

| Thickness of insulating dielectric layer (mm) | 0.3 | 0.5 | 1.0 | 1.5 | 2.0 |
|---|---|---|---|---|---|
| Attracting force (g/cm$^2$) | 280 | 210 | 135 | 95 | 60 |
| Thickness of insulating dielectric layer (mm) | 3.0 | 4.0 | 5.0 | 6.0 | — |
| Attracting force (g/cm$^2$) | 45 | 35 | 30 | 5 | — |

TABLE 2

| Thickness of insulating dielectric layer (mm) | 0.3 | 0.5 | 1.0 | 1.5 | 2.0 |
|---|---|---|---|---|---|
| Attracting force (g/cm$^2$) | 395 | 360 | 180 | 155 | 105 |
| Thickness of insulating dielectric layer (mm) | 3.0 | 4.0 | 5.0 | 6.0 | — |
| Attracting force (g/cm$^2$) | 60 | 45 | 40 | 10 | — |

As is clear from the results, reduction in the attracting force is relatively small in the case of the insulating dielectric layer being in a thickness range of 0.5 to 5.0 mm, and preferably in a thickness range of 1.0 to 3.0 mm. In particular, a semiconductor could be sufficiently stably attracted in the case that the pressure of the gas was about 20 torr.

Experiment 2

An electrostatic chuck was produced in the same manner as in Experiment 1, and the attracting force was tested in the same way as in Experiment 1. In Experiment 2, the hot press temperature was set at 1800° C., and the volume resistivity of the insulating dielectric layer was controlled to $1 \times 10^{15}$ Ω·cm at room temperature.

The electrostatic chuck was placed in a vacuum chamber, and was heated up to 400° C. by feeding electric power to a resistive heating element. The volume resistivity of the insulating dielectric layer at 400° C. was $5 \times 10^8$ Ω·cm The voltage applied to the electrostatic chuck was 500 V. Results are shown in FIG. 3 with respect to the insulating dielectric layers having different average thicknesses. An area of an attracting portion of the stainless weight 6 used to test the attracting force was 1 cm$^2$, and the leakage current flown to the weight was simultaneously measured. Since the area of an 8-inch semiconductor wafer is about 300 cm$^2$, a leakage current which would flow the 8-inch wafer was presumed by multiplying a measurement value by 300. The thus obtained leakage currents are shown in Table 3.

TABLE 3

| Thickness of insulating dielectric layer (mm) | 0.3 | 0.5 | 1.0 | 1.5 | 2.0 |
|---|---|---|---|---|---|
| Attracting force (g/cm$^2$) | 260 | 205 | 130 | 110 | 75 |
| Leaked current in 8 inch size (mA) | 20 | 8 | 3 | 1.5 | — |
| Thickness of insulating dielectric layer (mm) | 3.0 | 4.0 | 5.0 | 6.0 | — |
| Attracting force (g/cm$^2$) | 60 | 25 | 20 | 0 | — |
| Leaked current in 8 inch size (mA) | 0.5 | 0.3 | 0.2 | 0.2 | — |

The smaller the thickness of the insulating dielectric layer, the larger is the intensity of the electric field (voltage/thickness). As is seen from Table 3, it seems that the larger the intensity of the electric field, the more likely does the current flow, but the amount of the current was not in inverse proportion to the thickness of the insulating dielectric layer.

Therefore, even when the volume resistivity of the insulating dielectric layer was reduced down to $10^8$ Ω·cm, the leakage current in the wafer having a large area like the 8-inch wafer could be largely reduced, and the attracting force was sufficient for holding such a wide-area wafer.

Experiment 3

An electrostatic chuck having such a configuration as shown in FIGS. 6 and 7 was produced in the same manner as in Experiment 1. The hot press temperature was set at 1910° C., and the volume resistivity of the insulating dielectric layer was controlled to $1 \times 10^{11}$ Ω·cm at room temperature. The thickness of the insulating dielectric layer was adjusted to 1.0 mm.

The porosity, the maximum pore diameter, and the surface roughness, Rmax, of the insulating dielectric layer were controlled as shown in Tables 4 and 5.

The porosity of 0.1% and the maximum pore diameter of 0.5 μm were attained by setting the hot press pressure at 200 kg/cm$^2$. The densification was suppressed by setting the hot press pressure at not more than 50 kg/cm$^2$, so that a sintered body having a porosity of 3% or 5% and a maximum pore diameter of 1 μm or 2 μm was obtained. Further, metallic aluminum was incorporated as a pore-forming agent into a powdery raw material, so that a sintered body having the maximum pore diameter of 5 μm or 10 μm was obtained, and influences of machining conditions upon the surface roughness, Rmax, were examined from various aspects.

Figure 8:
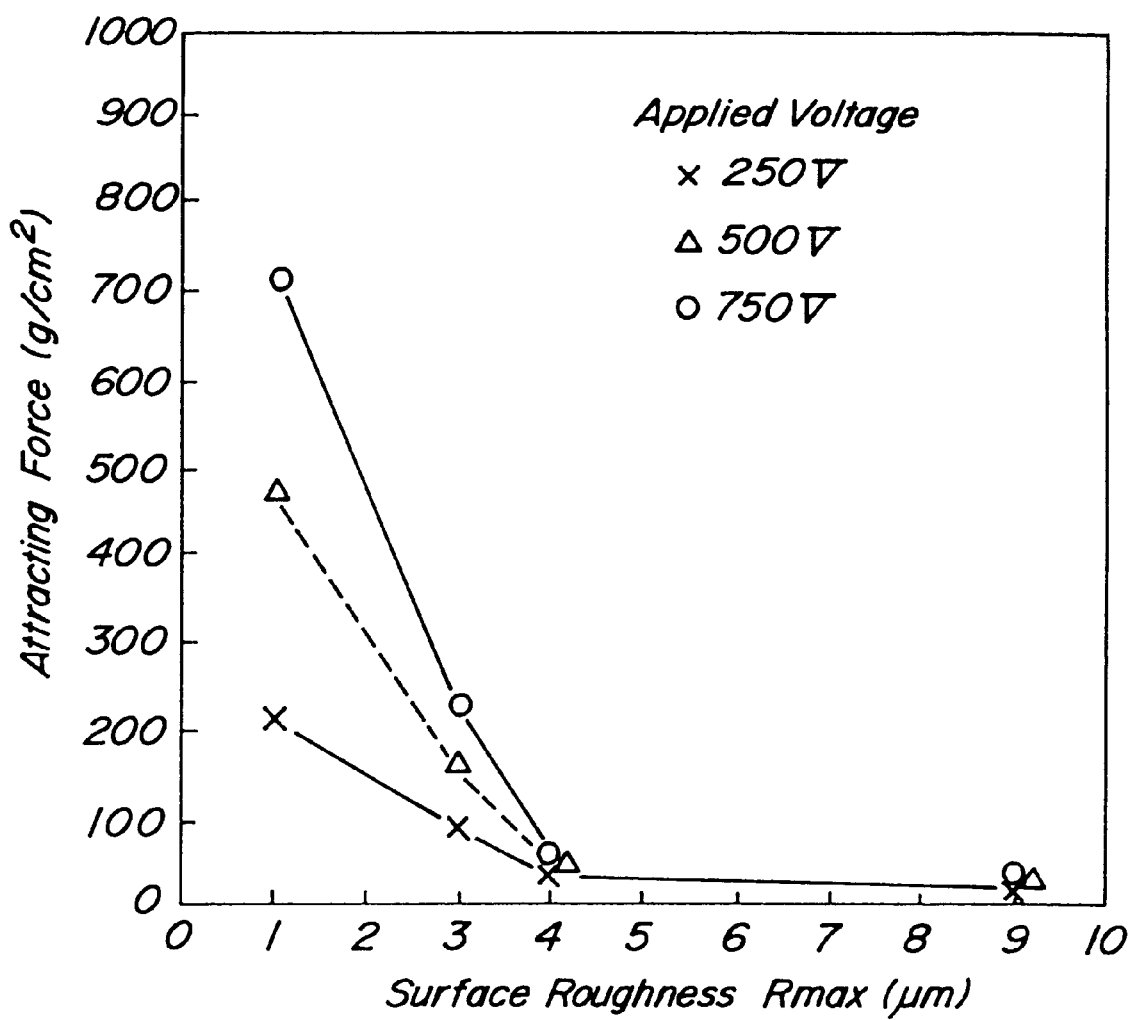
FIG. 8 is a graph showing the relationship between the surface roughness, Rmax, of the insulating dielectric layer, the voltage applied to the insulating dielectric layer and the attracting force of the electrostatic chuck.

Each electrostatic chuck was placed in a vacuum chamber, and the electrostatic chuck was controlled to 100° C. by feeding electric power to a resistive heating element 19. The volume resistivity of the insulating dielectric layer at 100° C. was $8 \times 10^9$ Ω·cm. The attracting force was measured by the method explained with reference to FIG. 2. The voltage was set at 250 V, 500 V or 750 V. Measurement results of the attracting force are shown in Tables 4 and 5 and FIG. 8.

TABLE 4

| Surface roughness, Rmax, of insulating dielectric layer (μm) | Porosity of insulating dielectric layer (%) | maximum Pore diameter of insulating dielectric layer (μm) | Voltage applied to insulating dielectric layer (V) | Attracting force of electrostatic chuck (g/cm$^2$) |
|---|---|---|---|---|
| 9 | 0.1 | 0.5 | 250 | 20 |
| 9 | 0.1 | 0.5 | 500 | 35 |
| 9 | 0.1 | 0.5 | 750 | 40 |
| 4 | 0.1 | 0.5 | 250 | 40 |
| 4 | 0.1 | 0.5 | 500 | 55 |
| 4 | 0.1 | 0.5 | 750 | 60 |
| 3 | 0.1 | 0.5 | 250 | 100 |
| 3 | 0.1 | 0.5 | 500 | 170 |
| 3 | 0.1 | 0.5 | 750 | 230 |
| 1 | 0.1 | 0.5 | 250 | 210 |
| 1 | 0.1 | 0.5 | 500 | 470 |
| 1 | 0.1 | 0.5 | 750 | 720 |

TABLE 5

| Surface roughness, Rmax, of insulating dielectric layer (μm) | Porosity of insulating dielectric layer (%) | maximum Pore diameter of insulating dielectric layer (μm) | Voltage applied to insulating dielectric layer (V) | Attracting force of electrostatic chuck (g/cm²) |
|---|---|---|---|---|
| 3 | 3 | 1 | 250 | 95 |
| 3 | 3 | 1 | 500 | 160 |
| 3 | 3 | 1 | 750 | 210 |
| 3 | 5 | 2 | 250 | 40 |
| 3 | 5 | 2 | 500 | 60 |
| 3 | 5 | 2 | 750 | 95 |

As is clear from the above results, if the surface toughness, Rmax, of the insulating dielectric layer is not less than 4 μm, the attracting force is not increased even if the voltage applied to the insulating dielectric layer is raised, whereas if the surface roughness, Rmax, is not more than 3 μm, the attracting force is not only increased but also the attracting force sharply varies to respond to the increase in the voltage applied to the insulating dielectric layer. Further, it was also clarified that if the surface roughness, Rmax, is set at not more than 3 μm and if the porosity is set at not more than 3%, the attracting force is most enhanced. Examination of various maching conditions revealed that if the maximum pore diameter of the insulating dielectric layer is not more than 5 μm, the surface roughness, Rmax, can be controlled to 3 μm.

Experiment 4

An electrostatic chuck as shown in FIGS. 6 and 7 was produced. Aluminum nitride powder containing yttria as a sintering aid and having a purity of 95% was used. An electrode was buried in a green body composed of this powder, and a sintered body was produced by hot press sintering the green body. As the electrode, a metal net made of molybdenum was used. A metal net obtained by knitting molybdenum wires having diameter of 0.3 mm at a density of 20 wires per inch was used. A molybdenum wire was buried as a resistive heating element. The surface of an insulating dielectric layer was machined to set its thickness at 3.0 mm. A hole was formed from a rear face side by using a machining center, and a terminal was joined to the electrode.

Round projections 26, a circular portion and trapezoidal-section portions were formed by sand blasting such that the height of the projections 26 from the circular portion or the trapezoidal-section portions were 20 μm. Each of gas-diffusing depressions was 3.0 mm in width and 1.0 mm in depth. The distance between the bottom face of the gas-diffusing depression and the electrode was 2.0 mm.

The relative density of the aluminum nitride sintered body constituting the substrate and the insulating dielectric layer was 99.9%. In this case, if the dielectric breakdown resistance is at least 10 kV/mm and the distance between the bottom face of the gas-diffusing depression and the electrode is 500 μm, the dielectric breakage resistance is not less than 5 kV. This gives 5 times safety degree as considered from the driving voltage of the electrostatic chuck of 500 V to 1000 V. Further, if the average thickness of the insulating dielectric layer is set at 3.0 mm, the distance between the bottom face of the gas-diffusing depression and the electrode can be 2.0 mm even if the depth of the gas-diffusing depression is 1.0 mm. Thus, the electrode needs not be partially removed there.

As mentioned above, according to the present invention, even if the electrostatic chuck for attracting an object to be treated is used in the temperature range in which the volume resistivity of the insulating dielectric layer would decrease, the leakage current in the insulating dielectric film can be reduced, and the object-attracting force can be simultaneously sufficiently highly maintained.

Further, when the gas-introducing hole is formed in the electrostatic chuck and opened at the attracting face of the insulating dielectric layer and the gas is fed to the depression at the attracting face, the difference in pressure inside the depression can be reduced so that heat conduction may be made uniform between the attracting surface of the chuck and every portion of the object to be treated and that the dielectric breakdown between the depression and the electrode can be prevented.

What is claimed is:

1. An electrostatic chuck for attracting an object to be treated, comprising a substrate, an insulating dielectric layer and at least one electrode provided between the substrate and the insulating dielectric layer, wherein said object is to be attracted onto at least one electrode via the insulating dielectric layer, a gas-introducing hole is provided at least in said insulating dielectric layer while being opened to an attracting surface of the insulating dielectric layer, at least one gas-diffusing depression is formed in the insulating dielectric layer on a side of said attracting surface, and a distance between a bottom surface of the gas-diffusing depression and at least one electrode is not less than 500 μm and not more than 5.0 mm.

* * * * *